(12) United States Patent
Magri et al.

(10) Patent No.: US 11,374,676 B2
(45) Date of Patent: Jun. 28, 2022

(54) OPTICAL DEVICE AND HUB NODE FOR AN OPTICAL NETWORK

(71) Applicant: Telefonaktiebolaget LM Ericsson (publ), Stockholm (SE)

(72) Inventors: Roberto Magri, Genoa (IT); Paolo Debenedetti, Genoa (IT); Riccardo Ceccatelli, Genoa (IT)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 17/048,179

(22) PCT Filed: Jun. 4, 2018

(86) PCT No.: PCT/EP2018/064612
§ 371 (c)(1),
(2) Date: Oct. 16, 2020

(87) PCT Pub. No.: WO2019/233543
PCT Pub. Date: Dec. 12, 2019

(65) Prior Publication Data
US 2021/0083792 A1   Mar. 18, 2021

(51) Int. Cl.
*H04B 10/075*     (2013.01)
*H04J 14/02*      (2006.01)
(Continued)

(52) U.S. Cl.
CPC ...... *H04J 14/0282* (2013.01); *H01S 5/06216* (2013.01); *H04B 10/0773* (2013.01); *H04J 14/0227* (2013.01); *H04L 1/0057* (2013.01)

(58) Field of Classification Search
CPC .................. H04B 10/0773; H04J 14/0227
See application file for complete search history.

(56) References Cited

U.S. PATENT DOCUMENTS

| 4,820,916 A | * | 4/1989 | Patriquin | ............. | H04B 10/807 |
| | | | | | 250/208.2 |
| 4,963,729 A | * | 10/1990 | Spillman | ............... | G01F 23/266 |
| | | | | | 398/171 |

(Continued)

FOREIGN PATENT DOCUMENTS

| EP | 2806583 A1 | 11/2014 |
| WO | 2013170909 A1 | 11/2013 |

OTHER PUBLICATIONS

Broadband Forum, "TR-311 Fiber Infrastructure Management System: Architecture and Requirements", The Broadband Forum Technical Report, Issue 1, Feb. 1, 2015, pp. 1-36, Broadband Forum.

(Continued)

*Primary Examiner* — Tanya T Motsinger
(74) *Attorney, Agent, or Firm* — Coats & Bennett, PLLC

(57) ABSTRACT

An optical device (100) for an optical network, comprising an optical input (110), a passive optical component (112), a memory device (114) for storing information relating to the passive optical component. The optical device further comprises an optical splitter (116) configured to power split off a portion of received optical signals to form split optical signals and to output the remaining optical power of received optical signals to the passive optical component and a photodetector (118) configured to receive the split optical signals and to generate a corresponding photodetector output signal. Further the optical device comprises an accumulator (120) configured to be charged by the photodetector output signal, a laser (122) configured to be powered by the accumulator and a controller (124) configured to, in response to a trigger from the photodetector, read said information from the memory device and to cause the laser to transmit an optical signal from an optical output (110), the (Continued)

optical signal carrying a message based on said information read from the memory device.

13 Claims, 10 Drawing Sheets

(51) Int. Cl.
*H04B 10/077* (2013.01)
*H04L 1/00* (2006.01)
*H01S 5/062* (2006.01)

(56) References Cited

U.S. PATENT DOCUMENTS

| | | | |
|---|---|---|---|
| 5,179,565 A | 1/1993 | Tsuchiya et al. | |
| 6,300,785 B1* | 10/2001 | Cook | G01R 31/311 324/754.21 |
| 6,421,362 B1* | 7/2002 | Matsunaga | H01S 3/0975 320/161 |
| 6,731,122 B2* | 5/2004 | Feng | G01R 31/311 324/762.03 |
| 7,684,702 B2* | 3/2010 | Lu | H04B 10/0773 398/67 |
| 8,194,238 B1* | 6/2012 | Hedger | G01M 11/3136 356/73.1 |
| 9,906,300 B2* | 2/2018 | Dinh | H04B 10/25 |
| 2004/0156635 A1* | 8/2004 | Felske | H04J 14/0227 398/66 |
| 2006/0188090 A1* | 8/2006 | Paulsen | H02J 13/00017 379/413.04 |
| 2009/0202238 A1* | 8/2009 | Straub | H04J 3/1694 398/25 |
| 2009/0210756 A1* | 8/2009 | Mikami | H04L 49/9021 714/E11.023 |
| 2009/0232494 A1* | 9/2009 | Hermann | H04Q 11/0067 398/43 |
| 2010/0231389 A1* | 9/2010 | Zank | G01V 15/00 340/572.1 |
| 2014/0334813 A1* | 11/2014 | Pastorelli | H04J 14/0269 398/25 |
| 2017/0338889 A1* | 11/2017 | Dinh | H04Q 9/00 |
| 2019/0094332 A1* | 3/2019 | Sackenreuter | G01S 5/14 |
| 2021/0083792 A1* | 3/2021 | Magri | H04B 10/0773 |
| 2021/0227119 A1* | 7/2021 | Dobrinsky | H04N 5/2256 |
| 2021/0351882 A1* | 11/2021 | Ayadurai | H04L 69/28 |

OTHER PUBLICATIONS

Imagineering—Ezine, "Optically Power RFID Tags and Optical Tag Readers", Dec. 11, 2015, pp. 1-2, retrieved on Feb. 21, 2018, retrieved from internet: http://www.imagineeringezine.com/e-zine/OPID.html.

* cited by examiner

150 GWS

| 152 Pre-amble | 154 Seed |
|---|---|
| 010101010101010 | 1110 1001 11 |

160 TWS

| 162 Pre-amble | 164 Target ID |
|---|---|
| 00110011001100 | 0010 1010 1001 0011 |

170 Response Sequence

| 172 Pre-amble | 174 Response |
|---|---|
| 111111111111100 | 1100101010111000100010101010101101001 |

OPTICAL DEVICE AND HUB NODE FOR AN OPTICAL NETWORK

TECHNICAL FIELD

The invention relates to an optical device for an optical network and to a hub node for an optical network. The method further relates to an optical link for an optical network. The method further relates to a method at an optical device of an optical network.

BACKGROUND

Optical networks will be increasingly important to support fifth generation radio access networks, 5G RAN, and specifically for cloud-RAN, C-RAN, applications. These networks use lots of passive optical devices distributed in unmanned sites for distribution of optical channels from baseband hotels to remote antenna sites. Passive optical devices filter and route optical connections between 5G radio components and introduce a certain amount of insertion loss that is very important to measure for optical budget calculations. 5G is also introducing new use cases for the Internet of Things, IoT, and the management of remote passive modules becomes an important part of the solution. This is much more important in the case of optical fibers with passive optical devices, such as filters, splitters and couplers, that will be located in outdoor sites that cannot be served by electrical power supply and communications.

Current practices for the management and discovery of passive optical devices, to obtain inventory and/or location information, are: manual data introduction through the Network Management System; in-field local reading through optical bar-codes; and in-field local reading through RFID technology. There is currently no method of automatic management and discovery of passive optical devices. In 2015, the Broadband Forum started a technical document relating to fiber infrastructure management: "TR-311 Fiber Infrastructure Management System: Architecture and Requirements". While this document highlights the importance of passive optical infrastructure management, it still focuses on fibers only and recognizes that RFID is the only current exploitable technology for management and discovery of passive optical devices. The current practices require manual operation, which can lead to missing or incorrect data, they require local reading of an optical barcode or RFID tag on the passive optical and they do not provide any information of how the passive optical devices are interconnected.

SUMMARY

It is an object to provide an improved optical device for an optical network. It is a further object to provide an improved hub node for an optical network. It is a further object to provide an improved optical link of an optical network. It is a further object to provide an improved method at an optical device of an optical network.

An aspect of the invention provides an optical device for an optical network. The optical device comprises an optical input for receiving optical signals, a passive optical component, a memory device, an optical splitter, a photodetector, an accumulator, a laser, a controller, and an optical output. The memory device is for storing information relating to the passive optical component. The optical splitter is configured to power split off a portion of received optical signals to form split optical signals and to output the remaining optical power of received optical signals to the passive optical component. The photodetector is configured to receive the split optical signals and is configured to generate a corresponding photodetector output signal. The accumulator is configured to be charged by the photodetector output signal. The laser is configured to be powered by the accumulator. The controller is configured to, in response to a trigger from the photodetector, read said information from the memory device and to cause the laser to transmit an optical signal carrying a message based on said information read from the memory device. The optical output is for outputting the optical signal.

The optical device may advantageously be operated without requiring any external electrical power supply, received optical signals instead being used to charge the accumulator, and is therefore a passive optical device in this respect. The optical device may therefore be located at road-side cabinets, poles, or manholes where no electrical power supply can be provided, and may therefore be particularly advantageous for use in access networks. The optical device is advantageously configured both to be powered by received optical signals and to transmit information in response to a received optical signal. The optical device may advantageously enable automatic discovery and management of passive optical components in optical networks, particularly in access networks.

In an embodiment, the received optical signals comprise an auxiliary channel optical signal at an auxiliary channel wavelength, the auxiliary channel optical signal providing the trigger at predetermined times. The optical device can be charged by the auxiliary channel optical signal and transmit information in response to the auxiliary channel optical signal.

In an embodiment, the received optical signals comprise traffic optical signals at traffic wavelengths and at least sometimes comprise a said auxiliary channel optical signal. The auxiliary channel wavelength is different to the traffic wavelengths. The optical device can be charged by both the traffic optical signals and the auxiliary channel optical signal and transmit information in response to the auxiliary channel optical signal.

In an embodiment, the traffic wavelengths of the traffic optical signals are within a traffic wavelength band and auxiliary channel wavelength is outside the traffic wavelength band.

In an embodiment, the optical signal is outside the traffic wavelength band.

In an embodiment, the optical signal is at the auxiliary channel wavelength.

In an embodiment, the trigger is a generic wake-up sequence and the information read from the memory device by the controller comprises information identifying the passive optical component. The optical device advantageously enables auto-discovery of passive optical components in an optical network.

In an embodiment, the controller is configured to, in response to a generic wake-up sequence, calculate a random time delay and to cause the laser to transmit the optical signal carrying the message after the calculated random time delay. This may minimise the occurrence of collisions between responses from more than one said optical device in an optical network.

In an embodiment, the controller is configured to, in response to a generic wake-up sequence, calculate a time delay based on the generic wake-up sequence and the information identifying the passive optical component. The controller is configured to cause the laser to transmit the optical signal carrying the message after the calculated time delay. This may minimise the occurrence of collisions between responses from more than one said optical device in an optical network.

In an embodiment, the information identifying the passive optical component is a serial number of the passive optical component.

In an embodiment, the generic wake-up sequence comprises a seed bit-sequence. The controller is configured to: calculate a cyclic redundancy check, CRC, checksum of the information identifying the passive optical component; and calculate the time delay based on the seed bit-sequence and the CRC checksum. This may minimise the likelihood of the same or closely spaced time delays being calculated at a plurality of said optical devices in an optical network, and thus may minimise the occurrence of collisions between responses from more said optical devices.

In an embodiment, the CRC checksum is a CRC16 checksum.

In an embodiment, the controller is configured to measure the time delay from receipt of the generic wake-up sequence. The optical device is advantageously not required to use power to operate a real-time clock, thereby preserving the power stored in the accumulator for responding to a trigger.

In an embodiment, the trigger is a target wake-up sequence comprising information identifying the passive optical component and the information read from the memory device by the controller comprises at least one measured parameter of the passive optical component. The optical device advantageously enables monitoring of passive optical components in an optical network.

In an embodiment, the controller is a complex programmable logic device. The controller could be implemented as one or more processors, hardware, processing hardware or circuitry.

Corresponding embodiments and advantages apply equally to the optical link described below.

A further aspect of the invention provides a hub node for an optical network, the optical network comprising at least one remote optical device comprising a passive optical component. The hub node comprises a plurality of optical transceivers, an auxiliary optical transceiver and a controller. The plurality of optical transceivers are configured to transmit and receive respective traffic optical signals at respective traffic wavelengths. The auxiliary optical transceiver is configured to transmit an auxiliary channel optical signal at an auxiliary channel wavelength. The auxiliary optical transceiver is also configured to receive optical signals at the auxiliary channel wavelength from the at least one remote optical device. The controller is configured to cause the auxiliary optical transceiver to transmit the auxiliary channel optical signal. The controller is also configured to detect information relating to a respective passive optical component carried on a said optical signal received by the auxiliary optical transceiver from the at least one remote optical device.

The hub node advantageously enables automatic discovery and management of passive optical components in optical networks, particularly in access networks. The hub node advantageously enables auto-discovery of passive optical components in an optical path from itself.

In an embodiment, the controller is configured to cause the auxiliary optical transceiver to transmit the auxiliary channel optical signal carrying a generic wake-up sequence at predetermined times. The hub node advantageously enables auto-discovery of passive optical components in an optical network.

In an embodiment, the generic wake-up sequence comprises a seed bit-sequence.

In an embodiment, the controller is configured to cause the auxiliary optical transceiver to transmit the auxiliary channel optical signal carrying a different generic wake-up sequence in response to more than one optical signal being received by the auxiliary channel transceiver at a same time. The controller may advantageously change the generic wake-up sequence to cause different delays to be calculated at a plurality of remote optical devices in response to a collision in responses from remote optical devices. The controller is advantageously enabled to implement a multiple access protocol to enable a plurality of remote optical devices communicate with it over the same physical fiber at different times, to avoid interference or collisions.

In an embodiment, the controller is configured to cause the auxiliary optical transceiver to transmit the auxiliary channel optical signal carrying a target wake-up sequence at predetermined times. The target wake-up sequence comprises information identifying a passive optical component. The hub node advantageously enables monitoring of passive optical components in an optical network.

In an embodiment, the auxiliary channel optical signal is a dedicated auxiliary channel for providing the trigger.

In an embodiment, the auxiliary channel optical signal is an auxiliary channel of the optical network. Preferably, the controller is configured to interrupt normal network operation of the auxiliary channel to transmit the auxiliary channel optical signal at predetermined times. An additional channel is therefore not required to be added to the network. In an alternative embodiment the controller may interrupt normal network operation of the auxiliary channel to transmit the auxiliary channel optical signal when initiated by a network operator or an event or alarm in the network.

The controller could be implemented as one or more processors, hardware, processing hardware or circuitry.

Corresponding embodiments and advantages apply equally to the optical link described below.

A further aspect of the invention provides an optical link of an optical network. The optical link comprises a hub node, at least one optical device, and an optical fibre link connecting the at least one optical device to the hub node. The optical device comprises an optical input for receiving optical signals, a passive optical component, a memory device, an optical splitter, a photodetector, an accumulator, a laser, a controller, and an optical output. The memory device is for storing information relating to the passive optical component. The optical splitter is configured to power split off a portion of received optical signals to form split optical signals and to output the remaining optical power of received optical signals to the passive optical component. The photodetector is configured to receive the split optical signals and is configured to generate a corresponding photodetector output signal. The accumulator is configured to be charged by the photodetector output signal. The laser is configured to be powered by the accumulator. The controller is configured to, in response to a trigger from the photodetector, read said information from the memory device and to cause the laser to transmit an optical signal carrying a message based on said information read from the memory device. The optical output is for outputting the optical signal. The hub node comprises a plurality of optical transceivers, an auxiliary optical transceiver and a controller. The plurality of optical transceivers are configured to transmit and receive respective traffic optical signals at respective traffic wavelengths. The auxiliary optical transceiver is configured to transmit an auxiliary channel optical signal at an auxiliary channel wavelength. The auxiliary optical transceiver is also configured to receive optical signals at the auxiliary channel wavelength from the at least one remote optical device. The controller is configured to cause the auxiliary optical transceiver to transmit the auxiliary channel optical signal. The controller is also configured to detect information relating to a passive optical component carried on a said optical signal received by the auxiliary optical transceiver from the at least one remote optical device.

The optical link advantageously exploits optical signals provided through the same optical fiber used to carry traffic signals through the passive optical components to charge the accumulators of the optical devices. The optical link advantageously enables remote optical devices to be reached over the same optical fiber used for communication, to power-up their accumulators and to exchange information, such as inventory and logistic information and measurements that can be used to determine fiber performance, with the hub node. The optical link advantageously enables automatic management of passive optical components in optical networks; access networks in particular.

A further aspect of the invention provides a method at an optical device of an optical network, the optical device comprising a passive optical component. The method comprises steps of: receiving at least one optical signal and converting the at least one optical signal into a corresponding electrical signal; detecting whether the at least one optical signal comprises a trigger; charging an accumulator with the electrical signal; in response to detecting a trigger, obtaining information relating to the passive optical component; and transmitting an optical signal carrying a message based on said information, the optical signal being generated using electrical power from the accumulator.

The method may advantageously enable the optical device be operated without requiring any external electrical power supply, received optical signals instead being used to charge the accumulator, keeping the optical device passive in this respect. The method advantageously enables the optical device to be located at road-side cabinets, poles, or manholes where no electrical power supply can be provided, which may be particularly advantageous in access networks. The method advantageously enables the optical device both to be powered by received optical signals and to transmit information in response to a received optical signal. The method may advantageously enable automatic discovery and management of passive optical components in optical networks, particularly in access networks.

In an embodiment, the trigger is a generic wake-up sequence and said information comprises information identifying the passive optical component. The method advantageously enables auto-discovery of passive optical components in an optical network.

In an embodiment, the method comprises steps of calculating a random time delay in response to detecting a generic wake-up sequence and transmitting the optical signal carrying the message after the calculated random time delay. This may minimise the occurrence of collisions between responses from more than one said optical device in an optical network.

In an embodiment, the method comprises steps of calculating a time delay in response to detecting a generic wake-up sequence and transmitting the optical signal carrying the message after the calculated time delay. The time delay is calculated based on the generic wake-up sequence and the information identifying the passive optical component. This may minimise the occurrence of collisions between responses from more than one said optical device in an optical network.

In an embodiment, the generic wake-up sequence comprises a seed bit-sequence. The method comprises steps of: calculating a cyclic redundancy check, CRC, checksum of the information identifying the passive optical component; and calculating the time delay based on the seed bit-sequence and the CRC checksum. This may minimise the likelihood of the same or closely spaced time delays being calculated at a plurality of said optical devices in an optical network, and thus may minimise the occurrence of collisions between responses from more said optical devices.

In an embodiment, the trigger is a target wake-up sequence comprising information identifying the passive optical component and said information comprises at least one measured parameter of the passive optical component. This may enable monitoring of passive optical components in an optical network.

An aspect of the invention provides a computer program, comprising instructions which, when executed on at least one processor, cause the at least one processor to carry out any of the above steps of the method at an optical device of an optical network.

An aspect of the invention provides a carrier containing a computer program, comprising instructions which, when executed on at least one processor, cause the at least one processor to carry out any of the above steps of the method at an optical device of an optical network. The carrier is one of an electronic signal, optical signal, radio signal, or computer readable storage medium.

References to processors, hardware, processing hardware or circuitry can encompass any kind of logic or analog circuitry, integrated to any degree, and not limited to general purpose processors, digital signal processors, ASICs, FPGAs, discrete components or logic and so on. References to a processor are intended to encompass implementations using multiple processors which may be integrated together, or co-located in the same node or distributed at different locations for example.

Embodiments of the invention will now be described, by way of example only, with reference to the accompanying drawings.

DETAILED DESCRIPTION

The same reference numbers will be used for corresponding features in different embodiments.

Figures 1, 2:
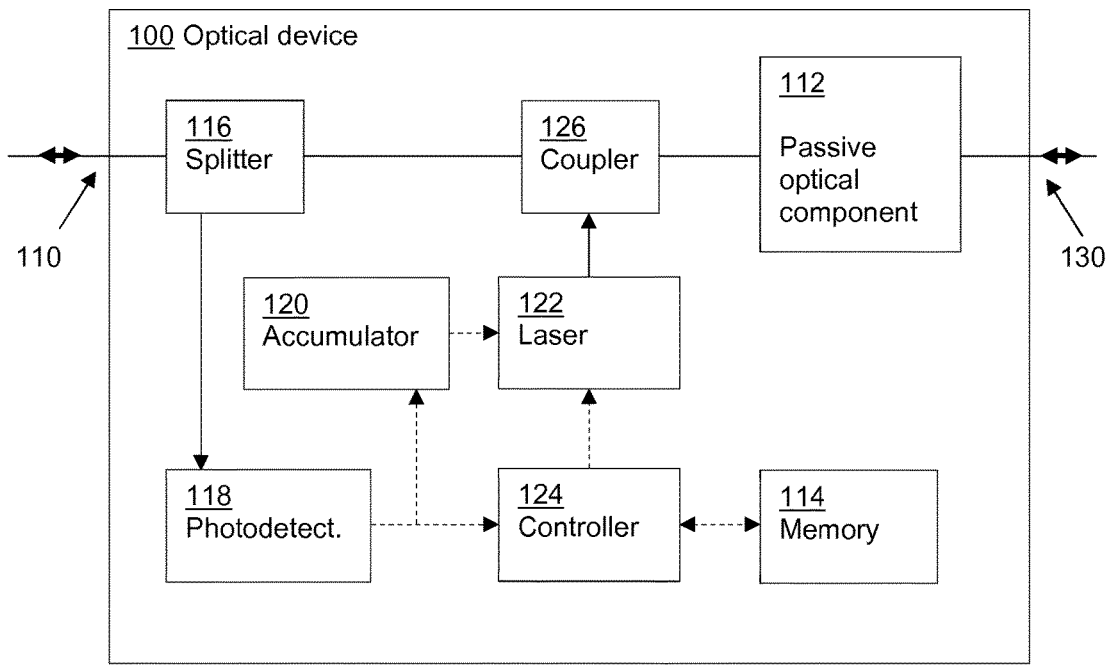
FIGS. 1, 3 and 4 are schematic representations of remote optical nodes according to embodiments of the invention.
FIG. 2 illustrates GWS and TWS bit sequences, and a Response sequence.

Referring to FIG. 1, an embodiment of the invention provides an optical device 100 for an optical link of an optical network. The optical device comprises an optical input 110 for receiving optical signals, a passive optical component 112, a memory device 114, an optical splitter 116, a photodetector 118, an accumulator 120, a laser 122, a controller 124, and an optical output 110.

The memory device 114 is for storing information relating to the passive optical component. The optical splitter 116 is configured to power split off a portion of received optical signals to form split optical signals, which is sent to the photodetector 118. The optical splitter is configured to output the remaining optical power of received optical signals to the passive optical component 112. For example, the optical splitter may be configured to split off 5% of the optical power of received optical signals; this is a standard splitting ratio used for optical monitoring in optical networks.

The photodetector 118 is configured to receive the split optical signals and is configured to generate a corresponding photodetector output signal.

The accumulator 120 is configured to be charged by the photodetector output signal and the laser 122 is configured to be powered by the accumulator.

The controller 124 is configured to, in response to a trigger from the photodetector, read the information from the memory device. The controller is also configured to cause the laser to transmit an optical signal carrying a message based on the information read from the memory device. In one embodiment a control signal is sent from the controller to the laser and the laser responds by transmitting an optical signal carrying a message based on the information read from the memory device. In an alternative embodiment powering up the laser initiated by the controller is enough to trigger this transmission.

The optical output 110 is for outputting the optical signal. In this example, an optical input/output 110 is provided for receiving downstream optical signals and for outputting upstream optical signals. A further optical input/output 130 is provided for outputting downstream optical signals from the passive optical component and for receiving upstream optical signals.

The optical device 100 is thus equipped with circuitry for storing information relating to the passive optical component and is configured to transmit the information in response to a trigger. The energy required for these operations is provided by photovoltaic conversion of received optical signals by the photodetector. In this way the optical device is "passive" in that it does not require an external electrical power supply, but at the same time it is configured to provide the electrical power required to enable interrogation of the passive optical component.

In an embodiment, the optical input 110 is for receiving an auxiliary channel optical signal at an auxiliary channel wavelength. Preferably, the auxiliary channel optical signal provides the trigger at predetermined times. The optical device is both charged by the auxiliary channel optical signal and transmits information in response to the auxiliary channel optical signal providing the trigger. The optical device may therefore be charged and transmit information relating to the passive optical component during commissioning of an optical network, when only an auxiliary channel is present and no traffic channels are being transmitted.

In an embodiment, the optical input 110 is for receiving traffic optical signals at traffic wavelengths and, at least sometimes, an auxiliary channel optical signal at an auxiliary channel wavelength, different to the traffic wavelengths. The optical device may therefore be charged by both the traffic optical signals and the auxiliary channel optical signal, and transmit information in response to the auxiliary channel optical signal providing a trigger.

Typically, the traffic wavelengths of the traffic optical signals will be within a traffic wavelength band, the auxiliary channel wavelength will outside the traffic wavelength band and the optical signal will be outside the traffic wavelength band, preferably at the auxiliary channel wavelength.

In an embodiment, the trigger is a generic wake-up sequence, GWS. Preferably, the auxiliary channel optical signal carries the GWS at predetermined times, and the photodetector is configured to convert the received auxiliary channel optical signal into a corresponding electrical output signal, also carrying the GWS. The controller 124 is configured to, in response to a GWS from the photodetector, read information from the memory device identifying the passive optical component, such as a serial number, a part number or other inventory information. The controller is configured to cause the laser to transmit an optical signal carrying a message based on the information identifying the passive optical component.

In an embodiment, the controller 124 is configured to, in response to a GWS, calculate a random time delay. The random delay may, for example, be calculated by generating a random number between 1 and 1023 and converting the random number into a corresponding delay of between 1 and 1200 seconds. The controller is configured to cause the laser to transmit the optical signal carrying the message after the calculated random time delay. The time delay is random to reduce the likelihood of collision between optical signals from more than one optical device 100, as described in more detail below.

In an embodiment, the controller 124 is configured to, in response to a GWS, calculate a time delay based on the GWS and the information identifying the passive optical component. The controller is configured to cause the laser to transmit the optical signal carrying the message after the calculated time delay; the delay is measured from the receipt of the GWS by the controller, which is set as time 0 s. Basing the time delay on the information identifying the passive optical component is to reduce the likelihood of collision between optical signals from more than one optical device 100, as described in more detail below.

In an embodiment, the information identifying the passive optical component is a serial number of the passive optical component.

Referring to FIG. 2, in an embodiment, the GWS 150 comprises a pre-amble bit sequence 152 and a seed bit-sequence 154. The seed bit-sequence may, for example, be a 10-bit binary bit-sequence, having a maximum decimal value of 1023. If longer delays are required, a longer, 16-bit seed bit-sequence may be used, having a maximum decimal value of 65535.

The controller 124 is configured to calculate a cyclic redundancy check, CRC, checksum of the information identifying the passive optical component, for example the controller may calculate a CRC16 checksum of the ASCII serial number of the passive optical component 112 using a CRC16 generator:

Serial Number: APF11250014K42
Serial Number (ASCII): 41 50 46 31 31 32 35 30 30 31 34 4B 34 32
CRC16 Checksum: 0xBCE3 in hexadecimal (48835 in decimal)

The seed bit-sequence in FIG. 2 has a decimal value of 935. The time delay is calculated as the remainder of the division of the CRC16 checksum decimal value with the seed bit-sequence decimal value:

Delay=MOD (48835; 935)=215 seconds

The controller 124 is configured to cause the laser to transmit an optical signal carrying a message based on the information read from the memory device, in this example a response sequence 170 comprising a pre-amble bit sequence 172 and a response bit-sequence 174, as illustrated in FIG. 2.

In an embodiment, the trigger is a target wake-up sequence, TWS, comprising information identifying the passive optical component. The information read from the memory device by the controller comprises at least one measured parameter of the passive optical component, such as optical power of received optical signals, temperature at the optical device, or positioning measurements.

Referring to FIG. 2, in an embodiment, the TWS 160 comprises a pre-amble bit sequence 162 and a Target ID bit sequence 164, which may represent the serial number of the passive optical component 112.

The controller 124 is configured to cause the laser to transmit an optical signal carrying a message based on the at least one measured parameter read from the memory device, in this example a response sequence 170 comprising a pre-amble bit sequence 172 and a response bit-sequence 174, as illustrated in FIG. 2.

Figure 3:
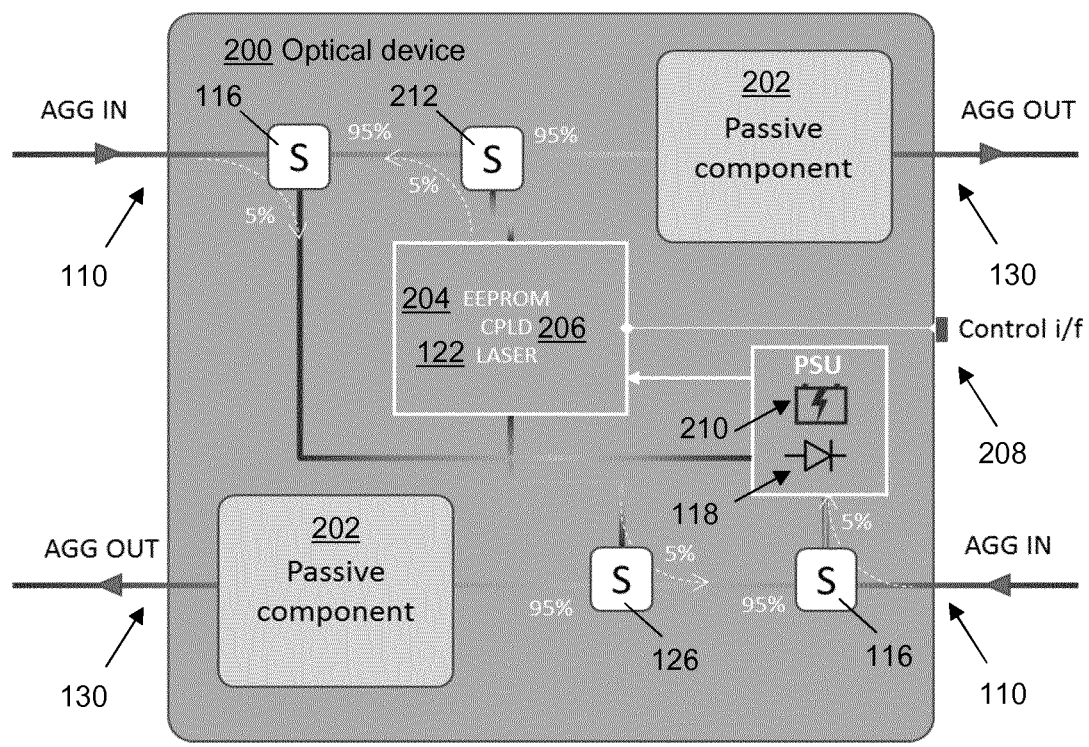

Referring to FIG. 3, an embodiment of the invention provides an optical device 200 for an optical link of an optical network. The optical device comprises an optical input 110 for receiving optical signals, a passive optical component 112, an EEPROM memory 204, an optical splitter 116, a photodetector 118, an accumulator 210, a laser 122, a controller 206, and an optical output 110.

The passive optical component may, for example, be a splitter, a filter, or an optical add/drop filter, or an optical multiplexer/demultiplexer. In this embodiment, the optical device is a Dual Fiber Working, DFW, device. In both transmission directions (AGG IN to AGG OUT) a first 5% optical splitter 116 is provided to power split off 5% of the received optical signals to form split optical signals, which are sent to the photodetector 118. The first optical splitter is configured to output the remaining optical power of received optical signals to the passive optical component 112. A second 5% optical splitter is provided in the optical path between the first optical splitter 116 and the passive optical component 202 in both directions, for coupling an optical signal transmitted by the laser 122 into the optical path. These splitters add a small insertion loss, of about 0.25 dB each one, to the main optical path.

The EEPROM is for storing information relating to the passive optical component, such as a serial number, a part number or other inventory information. The information may be written to the EEPROM via the control interface 208 during manufacture of the optical device or during set up of the passive optical component.

The accumulator in this embodiment is a photovoltaic supply unit, PSU, 120 configured to be charged by the photodetector output signal. The split optical signals are sufficient to provide the necessary photocurrent to recharge an accumulator of about 3 □Ah. For example, if the split optical power is −20 dBm (i.e. 0.01 mW collected across the whole spectrum of the received optical signals), accounting for the split ratio of 5% and considering also a poor responsivity of 30%, the resulting photocurrent is 0.15 □A. This means that it will take about 20 hours for a complete recharge of the PSU; if the optical power is greater than −20 dBm, using for example a dedicated out of band optical signal, the recharge time may be reduced.

The controller in this embodiment is a complex programmable logic device, CPLD, 206. The CPLD is configured to cause the laser to transmit an optical signal carrying a message based on the information identifying the passive optical component.

The PSU, once charged, can provide a current of 10 mA at a voltage of 3.3 V for 1 sec, which is sufficient to drive a laser 122 at a few dBm of optical power. This is sufficient to transmit an optical signal carrying an identification sequence at low bit rate and at a wavelength which is out of the optical bandwidth used by the system for traffic.

The CPLD is configured to control the photodetector and the laser, and may also be configured to periodically collect measurements, such as optical power of the received optical signals or temperature of the device. The CPLD is also configured to detect GWS and TWS triggers and to modulate the laser with a response sequence, as for example in FIG. 2, in on-off keying, OOK, at a low bit rate; a rate of 10 kbits is sufficient to send a 1250 bytes ID sequence in a second.

Figure 4:
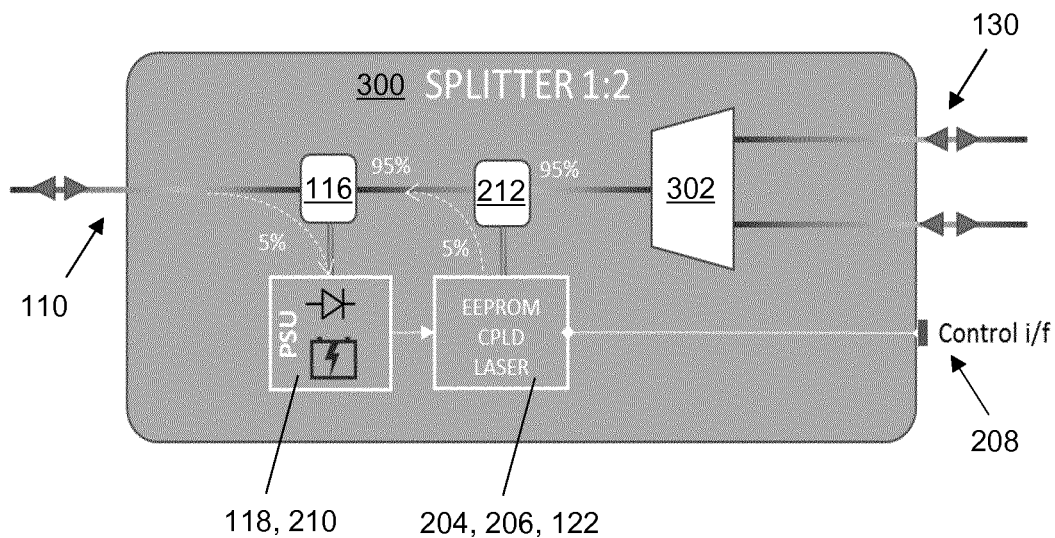

Referring to FIG. 4, an embodiment of the invention provides an optical device 300 for an optical link of an optical network, which is similar to the optical device 200 of FIG. 3. In this embodiment, the passive optical component is a 1:2 optical splitter 302, arranged for single fibre working, SFW.

Figure 5:
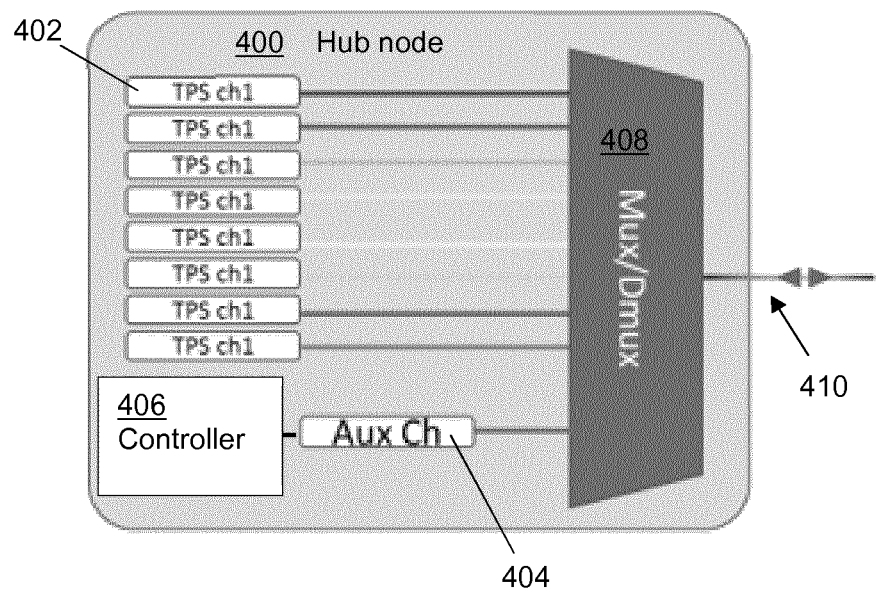
FIGS. 5 and 6 are schematic representations of hub optical nodes according to embodiments of the invention.

Referring to FIG. 5, an embodiment of the invention provides a hub node 400 for an optical link of an optical network, the optical link comprising at least one remote optical device comprising a passive optical component.

The hub node comprises a plurality of optical transceivers 402, an auxiliary optical transceiver 404, a controller 406, a multiplexer/demultiplexer 408 and an optical input/output 410. The plurality of optical transceivers 402 are configured to transmit and receive respective traffic optical signals at respective traffic wavelengths. The auxiliary optical transceiver 404 is configured to transmit an auxiliary channel optical signal at an auxiliary channel wavelength. The auxiliary optical transceiver is also configured to receive optical signals at the auxiliary channel wavelength from the at least one remote optical device.

The controller 406 is configured to cause the auxiliary optical transceiver to transmit the auxiliary channel optical signal. The controller is also configured to detect information relating to a respective passive optical component carried on a said optical signal received by the auxiliary optical transceiver from the at least one remote optical device.

The multiplexer/demultiplexer 408 is configured to multiplex and demultiplex the traffic optical signals and the auxiliary channel optical signal.

Figure 6:
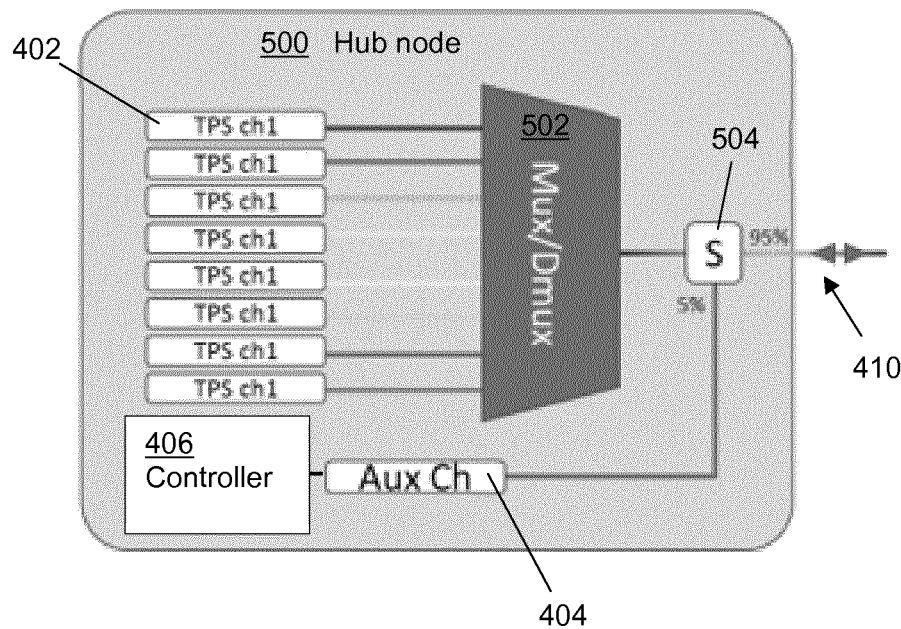

Alternatively, as in the embodiment illustrated in FIG. 6, the multiplexer/demultiplexer 408 is configured to multiplex and demultiplex the traffic optical signals and hub node 500 additionally comprises a 5% optical splitter 504 configured to multiplex/demultiplex the auxiliary optical channel signal with/from the traffic optical signals.

In an embodiment, the controller 406 is configured to cause the auxiliary optical transceiver 404 to transmit the auxiliary channel optical signal carrying a generic wake-up sequence, GWS, as described above, at predetermined times.

In an embodiment, the controller 406 is configured to cause the auxiliary optical transceiver to transmit the auxiliary channel optical signal carrying a further GWS in response to more than one optical signal being received by the auxiliary channel transceiver at a same time, in response to a first GWS. By transmitting a different GWS in response to a collision between optical signals received from different remote optical devices, different delays are calculated at the remote optical devices, reducing the likelihood of a collision occurring between optical signals transmitted in response to the further GWS.

In an embodiment, the controller 406 is configured to cause the auxiliary optical transceiver 404 to transmit the auxiliary channel optical signal carrying a target wake-up sequence, TWS, as described above, at predetermined times. The TWS comprises information identifying a passive optical component.

In an embodiment, the auxiliary channel optical signal is dedicated to "passive component" discovery and is designed to transmit and receive GWS triggers. Alternatively, other auxiliary channels already present in the optical network may be used, provided that, when necessary, they are able to interrupt their normal operation for a while to be used to transmit a GWS or TWS, and for optical signals carrying messages in response to be received at the auxiliary channel wavelength. The controller 406 is configured to interrupt normal network operation of the auxiliary channel to transmit the auxiliary channel optical signal at predetermined times. In an alternative embodiment the controller may interrupt normal network operation of the auxiliary channel to transmit the auxiliary channel optical signal when initiated by a network operator or an event or alarm in the network.

Figure 7:
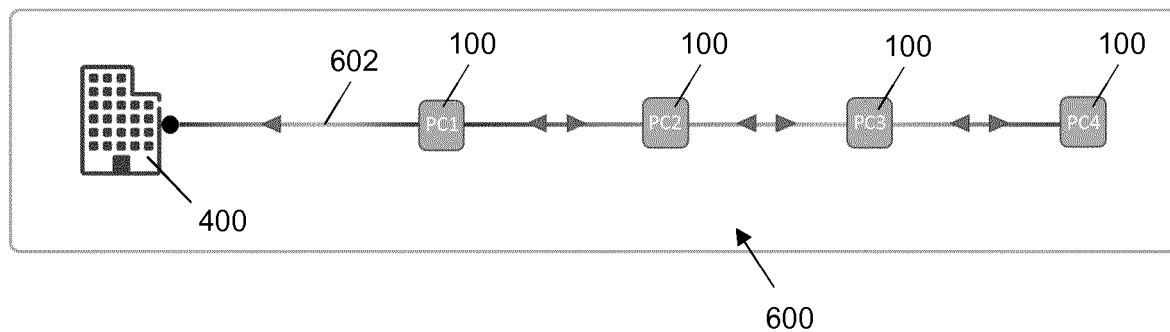
FIG. 7 is a schematic representation of an optical link according to an embodiment of the invention.

Referring to FIG. 7, an embodiment of the invention provides an optical link 600 of an optical network. The optical link comprises a hub node 400 as described above, a plurality of optical devices 100 as described above and an optical fibre link 602 connecting the optical devices to the hub node.

It will be appreciated that a hub node 500 as illustrated in FIG. 6 may alternatively be used and the optical devices 200, 300 illustrated in FIGS. 3 and 4 may be used in place of any of the optical devices 100.

The optical link 600 enables remote optical devices 100 to be reached over the same optical fiber 602 used for communication, power-up their battery and establish a multiple access protocol to let the optical devices communicate over the same physical fiber at different times, to avoid interference or collisions, to exchange inventory and logistic information, and measurements for monitoring fiber performances, with the hub node 400. The remote optical devices are required to have only limited backup power and are not required to stay always on with a real time clock.

The optical link 600 exploits optical power remotely provided through the same optical fiber used to carry traffic though the passive optical components to provide electrical power to the optical devices 100.

Each optical device is provided with a low-cost circuitry to store the information to identify the passive optical component and to send them to the hub node when requested. The energy required for these operations is obtained by the photovoltaic conversion of the optical power specifically sent for this purpose by the hub node (out of the band used for traffic) and/or by the optical power transmitted over the fiber for traffic itself. This way the optical component remains "passive", but at the same time it is provided with a minimum circuitry enabling the tele-discovery of the optical device by a hub node belonging to the same optical link.

The optical devices are in a charging mode most of the time and wake-up for a very short time, just to transmit an optical signal carrying a message in the right time-slot before sleeping again. As the electrical power stored in the accumulator can be very limited, the hub node is configured to implement a protocol to avoid collisions between optical signals sent by the optical devices, which would waste electrical power. The optical link may be implemented for example both in RAN transport networks and used in more general internet of things applications where passive optical components can be reached via optical fiber.

Figure 8:
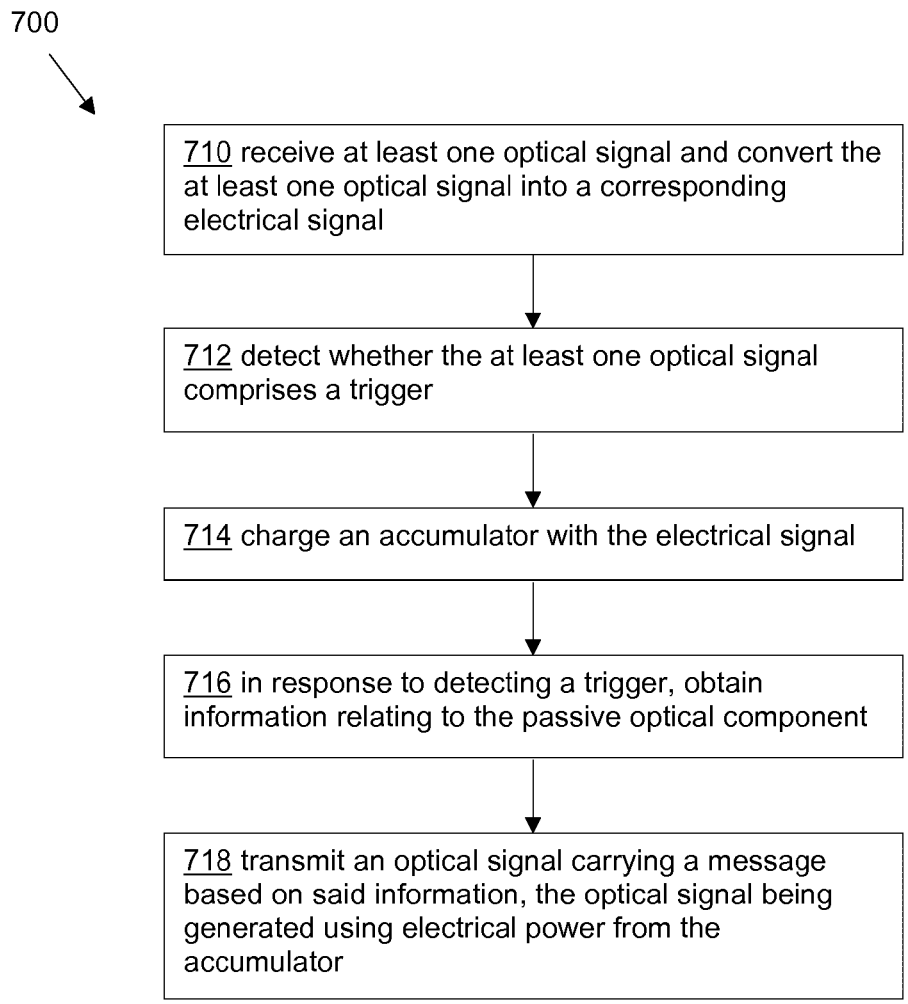
FIGS. 8 to 13 illustrate steps of methods at remote optical nodes, according to embodiments of the invention.

An embodiment of the invention provides a method 700 at an optical device of an optical network, the optical devices comprising a passive optical component. The steps of the method 700 are illustrated in FIG. 8.

The method 700 comprises steps of:
receiving 710 at least one optical signal and converting the at least one optical signal into a corresponding electrical signal;
detecting 712 whether the at least one optical signal comprises a trigger;
charging 714 an accumulator with the electrical signal;
in response to detecting a trigger, obtaining 716 information relating to the passive optical component; and
transmitting 718 an optical signal carrying a message based on said information, the optical signal being generated using electrical power from the accumulator.

Figure 9:
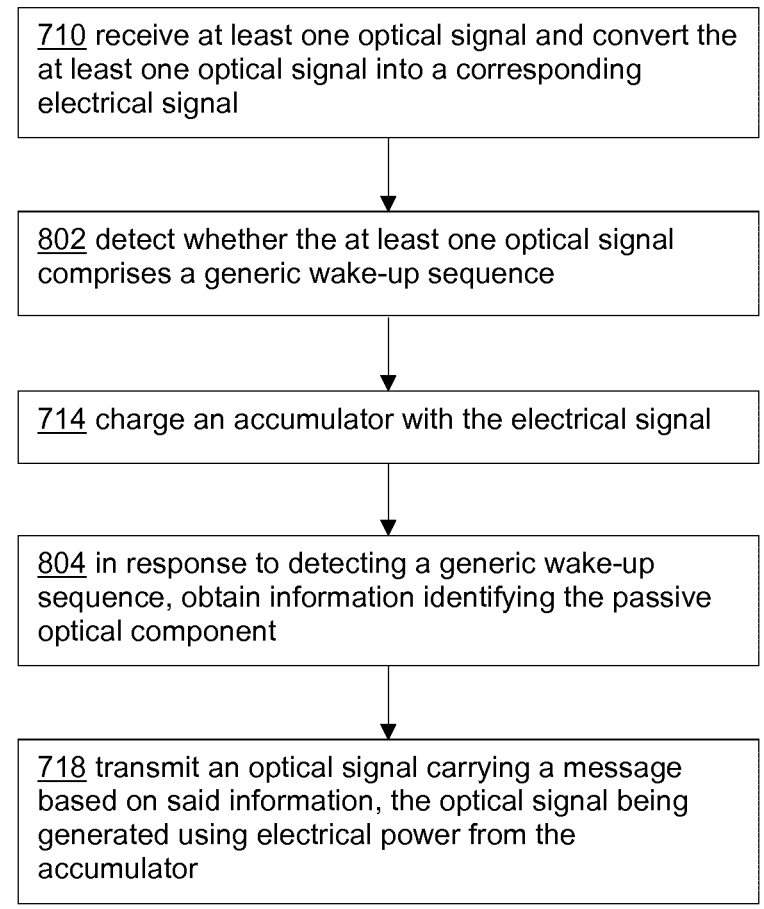

In an embodiment, as illustrated in FIG. 9, the trigger 802 is a generic wake-up sequence, GWS. The method 800 comprises detecting 802 whether the at least one optical signal comprises a GWS and, in response to detecting a GWS, obtaining information identifying the passive optical component 804. In one embodiment, the operation of detecting a trigger (e.g. GWS) is performed based on the electrical signal (i.e. in the electrical domain) obtained after optical-to-electrical conversion of the at least one optical signal. Alternatively, the operation of detecting may be performed based on the at least one optical signal (i.e. in the optical domain).

Figure 10:
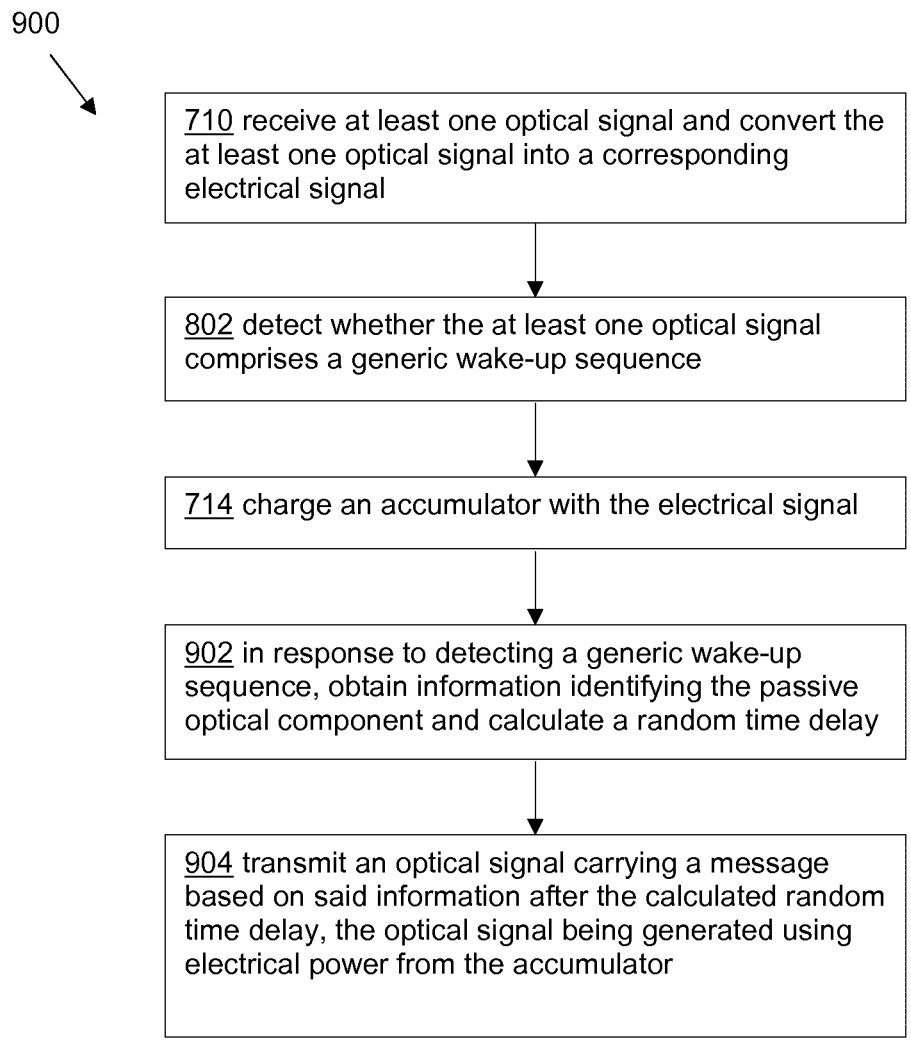

In an embodiment, as illustrated in FIG. 10, the method 900 comprises, in response to detecting a GWS, obtaining information identifying the passive optical component and calculating 902 a random time delay. The random delay may, for example, be calculated by generating a random number between 1 and 1023 and converting the random number into a corresponding delay of between 1 and 1200 seconds. The optical signal is transmitted 904 after the calculated time delay; the delay is measured from the time of receipt of the GWS, which is set as time 0 s.

Figure 11:
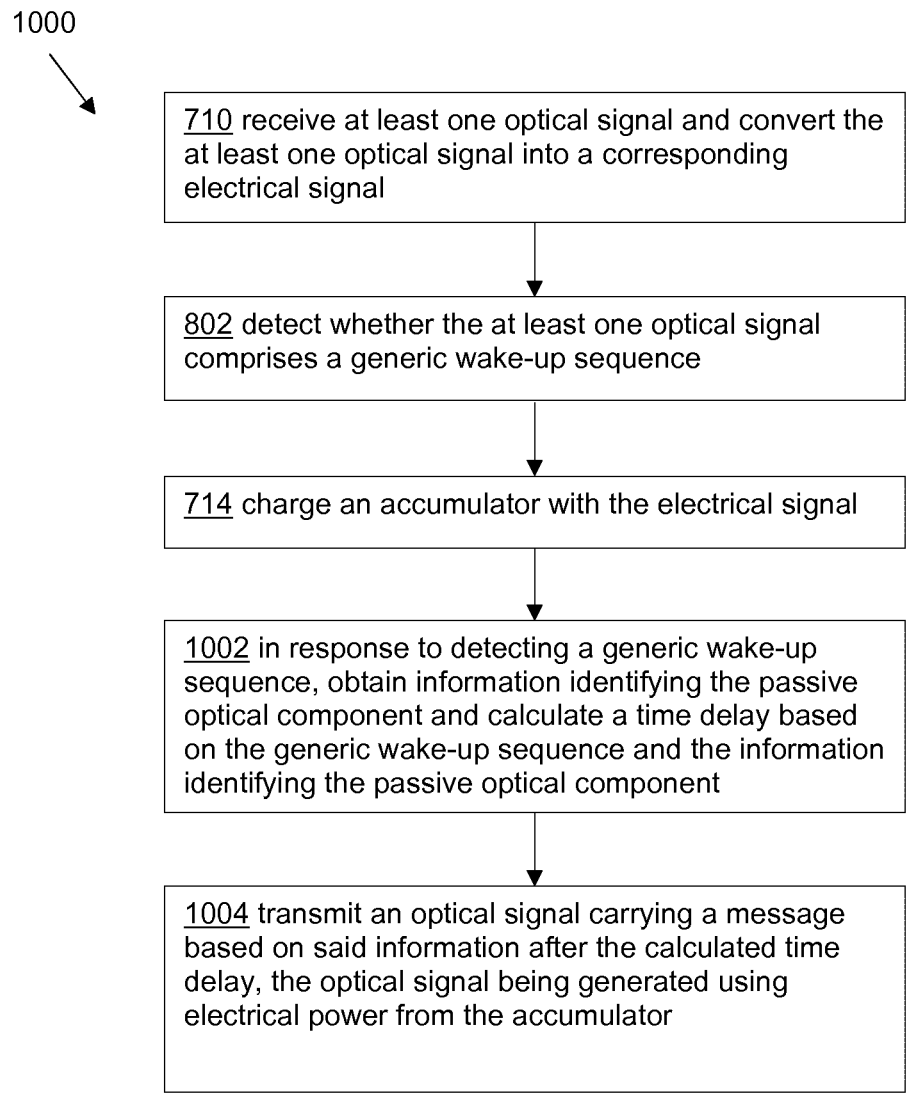

In an embodiment, as illustrated in FIG. 11, the method 1000 comprises, in response to detecting a GWS, obtaining information identifying the passive optical component. The method comprises calculating 1002 a time delay based on the GWS and the information identifying the passive optical component. The optical signal is transmitted 1004 after the calculated time delay.

Figure 12:
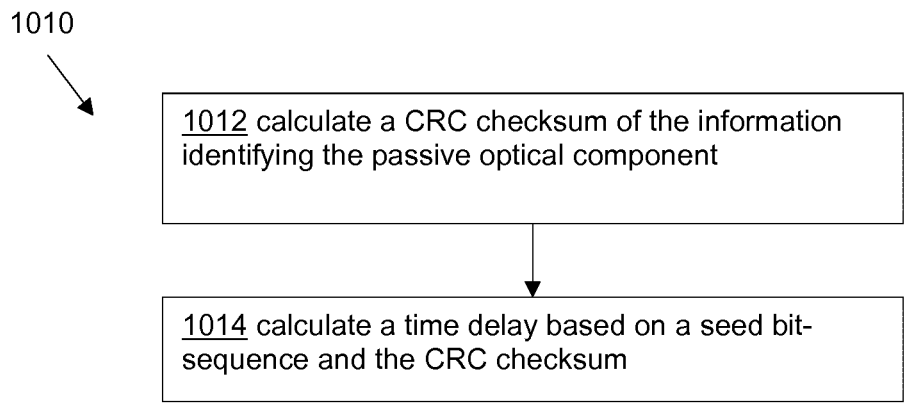

In an embodiment, as illustrated in FIG. 12, the GWS comprises a seed bit-sequence. The method 1000 comprises steps 1010 of:
calculating 1012 a cyclic redundancy check, CRC, checksum of the information identifying the passive optical component; and
calculating 1014 the time delay based on the seed bit-sequence and the CRC checksum.

Referring to FIG. 2, in an embodiment, the GWS 150 comprises a pre-amble bit sequence 152 and a seed bit-sequence 154. The seed bit-sequence may, for example, be a 10-bit binary bit-sequence, having a maximum decimal value of 1023. If longer delays are required, a longer, 16-bit seed bit-sequence may be used, having a maximum decimal value of 65535.

The method comprises calculating a CRC checksum of the information identifying the passive optical component, for example a CRC16 checksum of the ASCII serial number of the passive optical component 112 may be calculated using a CRC16 generator:

Serial Number: APF11250014K42
Serial Number (ASCII): 41 50 46 31 31 32 35 30 30 31 34 4B 34 32
CRC16 Checksum: 0xBCE3 in hexadecimal (48835 in decimal)

The seed bit-sequence in FIG. 2 has a decimal value of 935. The time delay is calculated as the remainder of the division of the CRC16 checksum decimal value with the seed bit-sequence decimal value:

Delay=MOD (48835; 935)=215 seconds

The method comprises transmitting an optical carrier signal carrying a message based on the information read from the memory device, in this example a response sequence 170 comprising a pre-amble bit sequence 172 and a response bit-sequence 174, as illustrated in FIG. 2.

Figure 13:
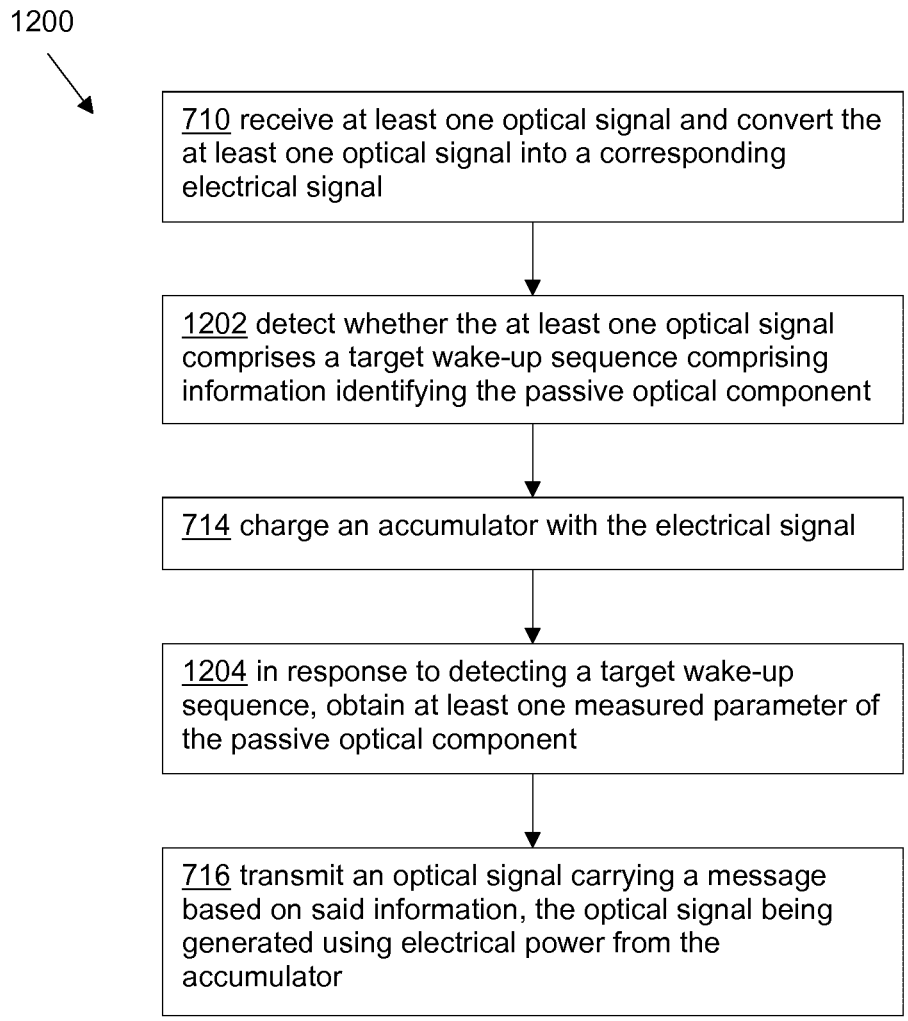

In an embodiment, as illustrated in FIG. 13, the trigger is a target wake-up sequence, TWS, comprising information identifying the passive optical component. The method 1200 comprises detecting 1202 whether the at least one optical signal comprises a TWS and, in response to detecting a TWS, obtaining 1204 information at least one measured parameter of the passive optical component.

Referring to FIG. 2, in an embodiment, the TWS 160 comprises a pre-amble bit sequence 162 and a Target ID bit sequence 164, which may represent the serial number of the passive optical component 112.

The method comprises transmitting an optical signal carrying a message based on the at least one measured parameter read from the memory device, in this example a response sequence 170 comprising a pre-amble bit sequence 172 and a response bit-sequence 174, as illustrated in FIG. 2.

Figure 14:
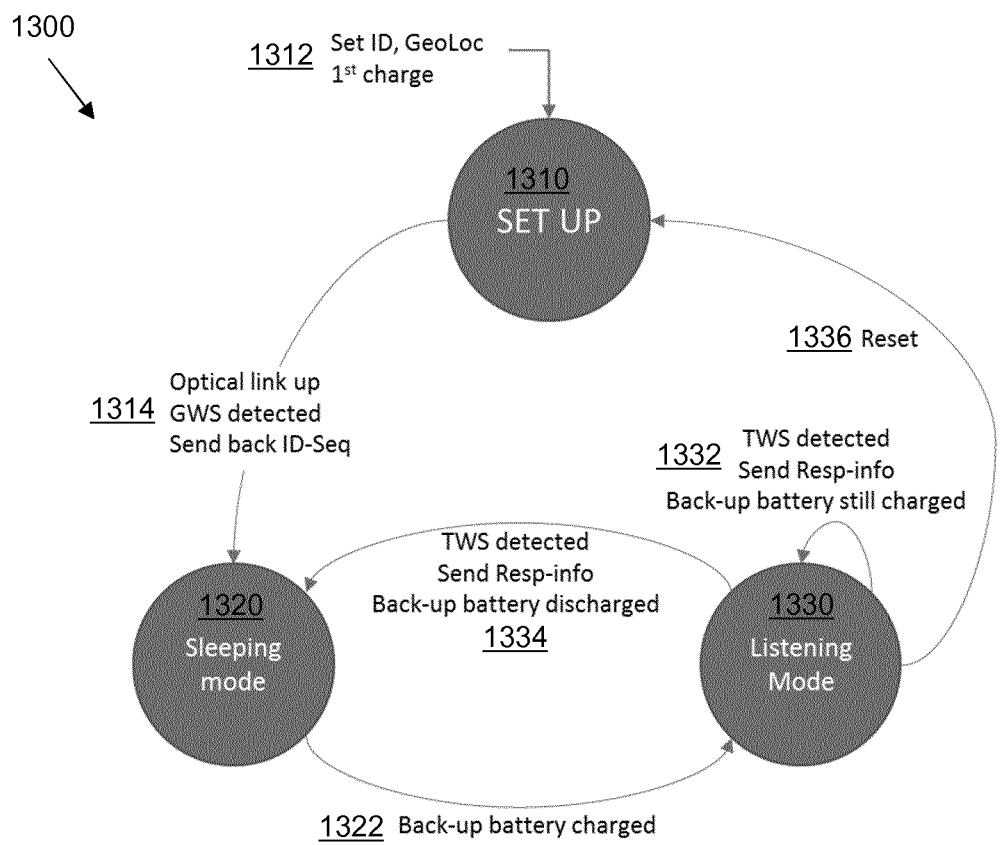
FIG. 14 is a state machine illustrating operation of a remote optical node according to an embodiment of the invention.

FIG. 14 illustrates a state-machine of a method 1300 at an optical device of an optical network, according to an embodiment of the invention. The optical network comprises an optical link as illustrated in FIG. 7.

At set up 1310, a user writes 1312 Identification information of the passive optical component to the memory of the optical device 100. Location information may also be written to the memory and an initial charge may be delivered to the accumulator 120.

Once the optical device 100 is connected to the fiber 602 and the optical link 600 is switched on 1314, as soon as the controller of the optical device detects a GWS causes the laser to transmit an optical signal carrying a message responding to the hub node 400 with its Identification information and geo-localization, so providing to the hub node information for discovery of the optical device 100.

Following discovery, the optical device 100 go into a "Sleeping Mode" 1320 and starts recharging 1322 the accumulator if discharged, or if the accumulator has some charge, goes into a "Listening Mode" 1330, in which it re-charges the accumulator, but it has also sufficient energy to respond 1334 to a TWS from the hub node.

From Listening Mode, the optical device returns to Sleeping Mode if the accumulator is discharged 1334 or in response to an explicit operator "Reset" 1336 command is received.

Figure 15:
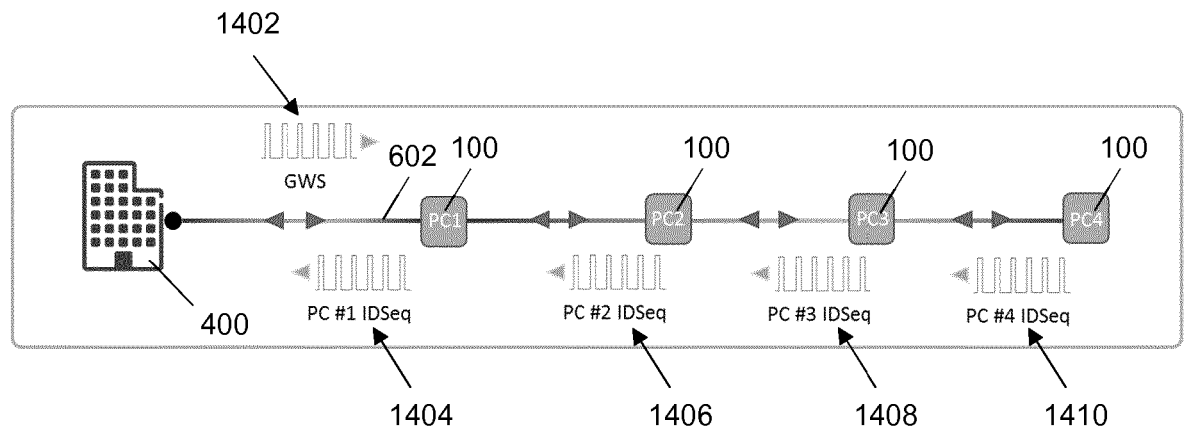
FIG. 15 is a schematic representation of the optical link of FIG. 7 illustrating operation of the hub optical node and the remote optical nodes for a generic wake-up sequence.

FIG. 15 illustrates operation of the hub optical node 400 and the remote optical devices 100 in the optical link 600 of FIG. 7, as described above, for tele-discovery of the remote optical devices.

Each optical device has information identifying its passive optical component 112, such as a Serial Number, a Part Number or other "inventory" information, stored in its memory device 114. In addition to this information, that can be written to the memory device in factory, an operator may, at set up time, add location information and other information useful for the network operator to manage the optical network infrastructure and its future maintenance, such as date/time of set up, the name or identification of the contractor that made the installation and the network owner of the infrastructure. The accumulator may be provided with sufficient initial charge to transmit an optical signal, carrying a message based on the information identifying the passive optical component, to the hub node 400.

Once the optical device is installed in the link, the photodetector 118 receives split optical signals and the accumulator is charged. The controller 124 listens for a wake-up sequence from the hub node.

The hub node 400 transmits an auxiliary channel optical signal providing a GWS 1402 to all of the optical devices 100 in the optical link 600 and then stops transmitting the auxiliary channel optical signal for a short period of time and waits for optical signals to be sent back at the auxiliary channel wavelength from the optical devices 100; this "response time" may be up to 1 hour per day.

Each remote optical device calculates a time delay based on the GWS and its own serial number, as described above, and then starts transmitting an optical signal carrying a respective identification sequence 1404, 1406, 1408, 1410 to the hub node after the wake-up sequence is terminated. The time delay has a value within the "Response time window".

As illustrated in FIG. 15, in this way each optical device along the optical link transmits its respective identification sequence PC #1 IDSeq 1404, PC #2 IDSeq 1406, PC #3 IDSeq 1408, PC #4 IDSeq 1410, at different times, due to the different response time calculated by each remote node.

The hub node may be configured to use a different GWS in each "Response time window" in order to minimize the probability of collisions between optical signals sent from different optical devices. In case a collision is detected by the hub node, the hub node will change the GWS used in the next "Response time window", resulting in the remote optical devices each calculating a new time delay, provided the accumulator has the sufficient charge or has been recharged in the meantime.

The hub node is thus able to "discover" the presence of all the passive optical components in the remote optical devices along the link and may store the respective identification information received via the ID Sequences. Location information, if present in the ID sequence, could be used to map the location of the passive optical components on the real optical network and verify/complete network provisioning plans.

Figure 16:
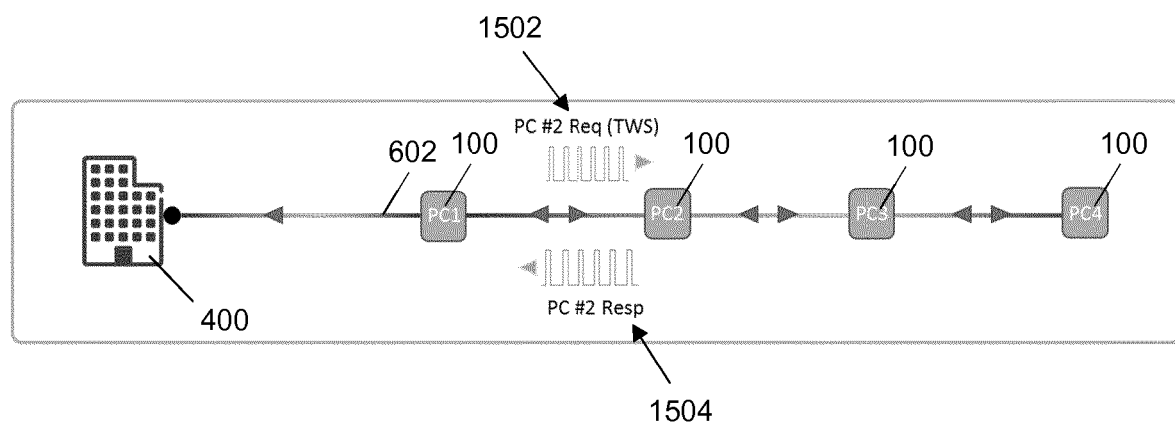
FIG. 16 is a schematic representation of the optical link of FIG. 7 illustrating operation of the hub optical node and a remote optical node for a target wake-up sequence.

FIG. 16 illustrates operation of the hub optical node 400 and the remote optical devices 100 in the optical link 600 of FIG. 7, as described above, for monitoring of the passive optical components in the remote optical devices.

Following the "discovery" process, the passive components go into a "sleeping mode" in which they continuously re-charge their accumulator using the received optical signals. The controller of each optical device is also configured to periodically store measure parameters of the optical device, such as optical power of the received optical signals, temperature, or any other possible sensors associated to their positioning.

The hub node 400 may be instructed to collect measure parameters from one of the optical devices in the optical link 600. The controller causes the auxiliary channel transponder to transmit an auxiliary channel optical signal providing a TWS for the specified remote optical device. The TWS contains information identifying the remote optical device, for example its serial number. Only the remote optical device with the corresponding serial number will recognize the TWS and transmit an optical signal carrying a message based on the available information: IDSequence and parameter measurements. For example, in FIG. 16 the hub node transmits an auxiliary channel optical signal providing a TWS sequence 1502 for the second remote optical device, PC2. The remote optical device recognizes the request because it contains the serial number of its passive optical component, and transmits an optical signal at the auxiliary channel wavelength carrying a message, PC #2 Resp, 1504 based on the IDSequence and parameter measurements stored within the memory device.

An embodiment provides a computer program, comprising instructions which, when executed on at least one processor, cause the at least one processor to carry out any of the above steps of the method 1200 at an optical device of an optical network.

An embodiment provides a carrier containing a computer program, comprising instructions which, when executed on at least one processor, cause the at least one processor to carry out any of the above steps of the method 1200 at an optical device of an optical network. The carrier is one of an electronic signal, optical signal, radio signal, or computer readable storage medium.

The invention claimed is:

1. An optical device for an optical network, comprising:
an optical input for receiving optical signals;
a passive optical component;
memory for storing information relating to the passive optical component;
an optical splitter configured to power split off a portion of received optical signals to form split optical signals and to output a remaining optical power of received optical signals to the passive optical component;
a photodetector configured to receive the split optical signals and configured to generate a corresponding photodetector output signal;
an accumulator configured to be charged by the photodetector output signal;
a laser configured to be powered by the accumulator;
a controller configured to, in response to a trigger from the photodetector, read the information from the memory and to cause the laser to transmit an optical signal carrying a message based on the information read from the memory; and
an optical output for outputting the optical signal.

2. The optical device of claim 1, wherein the received optical signals comprise an auxiliary channel optical signal at an auxiliary channel wavelength, the auxiliary channel optical signal providing the trigger at predetermined times.

3. The optical device of claim 2, wherein the received optical signals comprise traffic optical signals at traffic wavelengths and at least sometimes comprise the auxiliary channel optical signal, wherein the auxiliary channel wavelength is different to the traffic wavelengths.

4. The optical device of claim 2, wherein the trigger is a generic wake-up sequence, and wherein the information read from the memory by the controller comprises information identifying the passive optical component.

5. The optical device of claim 4, wherein the controller is configured to:
in response to a generic wake-up sequence, calculate a random time delay; and
cause the laser to transmit the optical signal carrying the message after the calculated random time delay.

6. The optical device of claim 4, wherein the controller is configured to:
in response to a generic wake-up sequence, calculate a time delay based on the generic wake-up sequence and the information identifying the passive optical component; and
cause the laser to transmit the optical signal carrying the message after the calculated time delay.

7. The optical device of claim 6:
wherein the generic wake-up sequence comprises a seed bit-sequence; and
wherein the controller is configured to:
calculate a cyclic redundancy check (CRC) checksum of the information identifying the passive optical component; and
calculate the time delay based on the seed bit-sequence and the CRC checksum.

8. A method at an optical device for an optical network, the optical device comprising a passive optical component; the method comprising:
receiving an optical signal;
power splitting a portion of the received optical signal to form a split optical signal, and outputting the remaining optical power of received optical signals to the passive optical component;
converting the split optical signal into a corresponding electrical signal;
detecting whether the split optical signal comprises a trigger;
charging an accumulator with the electrical signal;
in response to detecting a trigger, obtaining information relating to the passive optical component; and transmitting an optical signal carrying a message based on the information, the optical signal being generated using electrical power from the accumulator.

9. The method of claim 8, wherein the trigger is a generic wake-up sequence, and wherein the information comprises information identifying the passive optical component.

10. The method of claim 9, further comprising:
calculating a random time delay in response to detecting a generic wake-up sequence; and
transmitting the optical signal carrying the message after the calculated random time delay.

11. The method of claim 9, further comprising:
calculating a time delay in response to detecting a generic wake-up sequence; and
transmitting the optical signal carrying the message after the calculated time delay;
wherein the time delay is calculated based on the generic wake-up sequence and the information identifying the passive optical component.

12. The method of claim 11:
wherein the generic wake-up sequence comprises a seed bit-sequence; and
wherein the method comprises:
calculating a cyclic redundancy check (CRC) checksum of the information identifying the passive optical component; and calculating the time delay based on the seed bit-sequence and the CRC checksum.

13. The method of claim 8, wherein the trigger is a target wake-up sequence comprising information identifying the passive optical component, and wherein the information comprises at least one measured parameter of the passive optical component.

* * * * *